(12) United States Patent
Tomura et al.

(10) Patent No.: US 10,586,710 B2
(45) Date of Patent: Mar. 10, 2020

(54) ETCHING METHOD

(71) Applicant: TOKYO ELECTRON LIMITED, Tokyo (JP)

(72) Inventors: Maju Tomura, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/118,672

(22) Filed: Aug. 31, 2018

(65) Prior Publication Data
US 2019/0074190 A1    Mar. 7, 2019

(30) Foreign Application Priority Data

Sep. 1, 2017 (JP) ................... 2017-168789
Mar. 6, 2018 (JP) ................... 2018-039840
Aug. 30, 2018 (JP) ................... 2018-161816

(51) Int. Cl.
*H01L 21/311* (2006.01)
*H01L 21/033* (2006.01)
(Continued)

(52) U.S. Cl.
CPC .... *H01L 21/31116* (2013.01); *H01L 21/0332* (2013.01); *H01L 21/31144* (2013.01); *H01L 21/67017* (2013.01); *H01L 21/67109* (2013.01); *H01L 21/68757* (2013.01); *H01J 37/32091* (2013.01); *H01J 37/32467* (2013.01); *H01J 37/32715* (2013.01); *H01J 2237/002* (2013.01); *H01J 2237/24507* (2013.01); *H01J 2237/334* (2013.01); *H01L 21/67069* (2013.01); *H01L 21/6831* (2013.01); *H01L 27/11556* (2013.01); *H01L 27/11582* (2013.01)

(58) Field of Classification Search
CPC ....... H01J 2237/002; H01J 2237/24507; H01J 2237/334; H01J 37/32091; H01J 37/32467; H01J 37/32715; H01L 21/0332; H01L 21/31116; H01L 21/31144; H01L 21/67017; H01L 21/67069; H01L 21/67109; H01L 21/6831; H01L 21/68757; H01L 27/11556
USPC ....... 438/706, 710, 712, 714, 717, 719, 723, 438/736, 780, 715
See application file for complete search history.

(56) References Cited

U.S. PATENT DOCUMENTS 9,017,571 B2 * 4/2015 Umezaki ........... H01L 21/31116 216/58
9,837,312 B1 * 12/2017 Tan ..................... C23C 18/1628
(Continued)

*Primary Examiner* — Lan Vinh
(74) *Attorney, Agent, or Firm* — Rothwell, Figg, Ernst & Manbeck, P.C.

(57) ABSTRACT

Provided is a method of etching a silicon-containing film made of at least one of silicon oxide and silicon nitride. The etching method includes: (i) preparing a workpiece having a silicon-containing film and a mask provided on the silicon-containing film in a chamber body of a plasma processing apparatus, in which an opening is formed in the mask; and (ii) etching the silicon-containing film, in which plasma is produced in the chamber body from processing gas containing fluorine, hydrogen, and iodine in order to etch the silicon-containing film, and a temperature of the workpiece is set to a temperature of 0° C. or less.

17 Claims, 7 Drawing Sheets

(51) Int. Cl.
*H01L 21/687* (2006.01)
*H01L 21/67* (2006.01)
*H01J 37/32* (2006.01)
*H01L 27/11582* (2017.01)
*H01L 27/11556* (2017.01)
*H01L 21/683* (2006.01)

(56) References Cited

U.S. PATENT DOCUMENTS

2014/0199852 A1* 7/2014 Kimura ............. H01L 21/32135
438/738
2015/0056808 A1* 2/2015 Ogasawara ....... H01L 21/31116
438/694
2016/0343580 A1 11/2016 Hudson

* cited by examiner

ETCHING METHOD

CROSS-REFERENCE TO RELATED APPLICATIONS

This application is based on and claims priority from Japanese Patent Application Nos. 2017-168789, 2018-039840, and 2018-161816, filed on Sep. 1, 2017, Mar. 6, 2018, and Aug. 30, 2018, respectively, with the Japan Patent Office, the disclosures of which are incorporated herein in their entireties by reference.

TECHNICAL FIELD

An exemplary embodiment of the present disclosure relates to an etching method.

BACKGROUND

In manufacturing an electronic device, a silicon-containing film is etched by plasma. The silicon-containing film is made of a silicon-containing material such as silicon oxide or silicon nitride. For example, in manufacturing a NAND type flash memory having a three-dimensional structure, as the silicon-containing film, a multilayer film including a plurality of silicon oxide films and a plurality of silicon nitride films, which are alternately stacked on one another, is etched. A mask, which contains carbon such as amorphous carbon, is used as a mask to etch the silicon-containing film. An opening is formed in the mask.

The silicon-containing film needs to be etched in a film thickness direction thereof when the silicon-containing film is etched. That is, high verticality is required to etch the silicon-containing film. U.S. Patent Publication No. 2016/0343580 discloses a technology which protects a side wall surface that defines an opening formed by etching in order to obtain high verticality. Specifically, in one technology disclosed in U.S. Patent Publication No. 2016/0343580, a silicon-containing film is etched by plasma from fluorocarbon gas. In this technology, the side wall surface is protected by a carbon-containing material produced from fluorocarbon gas, and the silicon-containing film is etched by active species of fluorine produced from the fluorocarbon gas. In addition, in another technology disclosed in U.S. Patent Publication No. 2016/0343580, the process of etching the silicon-containing film by the active species of fluorine produced from the fluorocarbon gas and the process of forming a protective film by film forming processing are alternately performed.

SUMMARY

In an aspect, a method of etching a silicon-containing film is provided. The silicon-containing film is made of at least one of silicon oxide and silicon nitride. The etching method includes: (i) preparing a workpiece including a silicon-containing film and a mask provided on the silicon-containing film and having an opening formed therein, in a chamber body of a plasma processing apparatus; and (ii) etching the silicon-containing film. In the etching of the silicon-containing film, plasma is produced in the chamber body from a processing gas containing fluorine, hydrogen, and iodine, and a temperature of the workpiece is set to a temperature of 0° C. or less.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
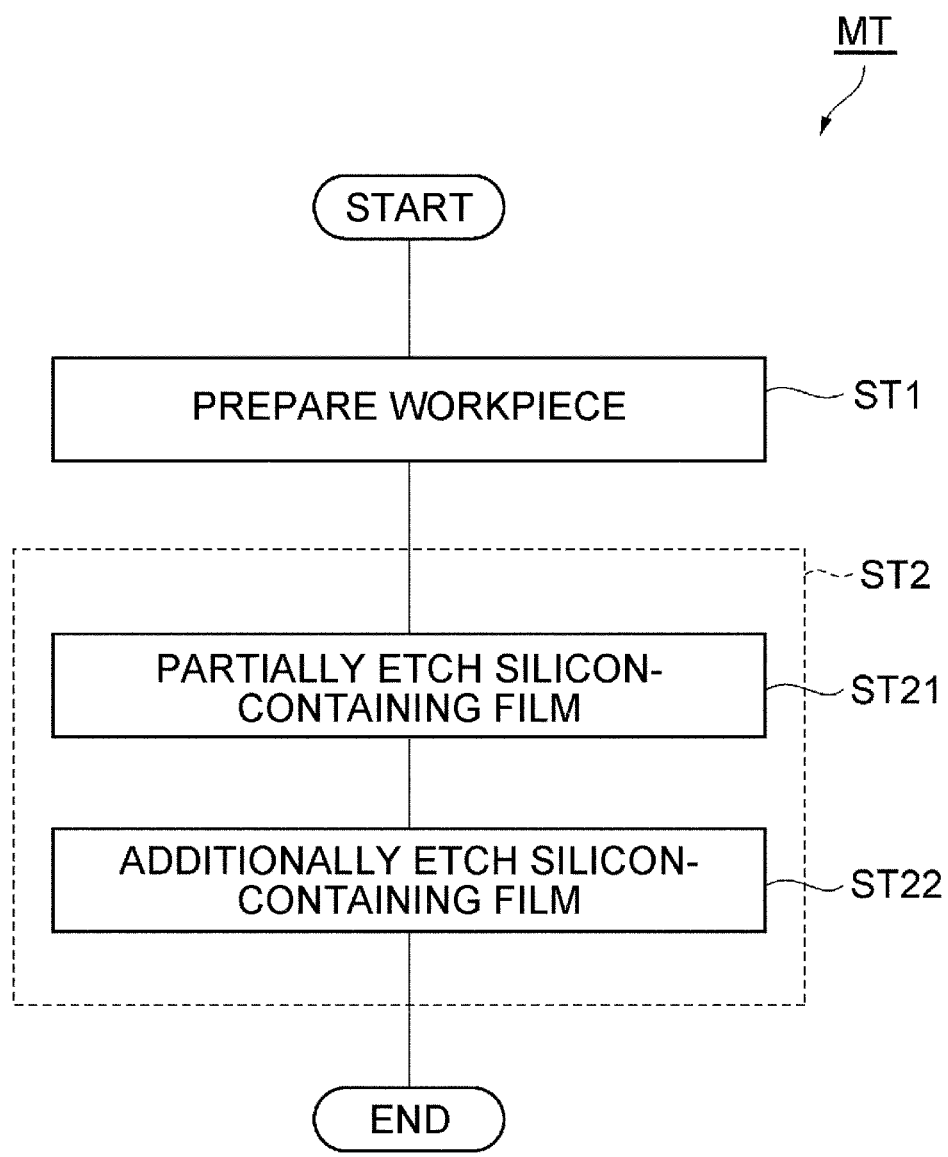
FIG. 1 is a flowchart illustrating an etching method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The processes are complicated in the latter technology among the technologies disclosed in U.S. Patent Publication No. 2016/0343580, that is, in the technology in which the process of etching the silicon-containing film by the active species of fluorine produced from the fluorocarbon gas and the process of forming the protective film by the film forming processing are alternately performed. Meanwhile, in the former technology, that is, in the process of etching the silicon-containing film by the plasma from the fluorocarbon gas, the silicon-containing film directly under the mask is etched in a lateral direction. Therefore, it is necessary to suppress the silicon-containing film directly under the mask from being etched in the lateral direction.

In an aspect, a method of etching a silicon-containing film is provided. The silicon-containing film is made of at least one of silicon oxide and silicon nitride. The etching method includes: (i) preparing a workpiece including a silicon-containing film and a mask provided on the silicon-containing film and having an opening formed therein, in a chamber body of a plasma processing apparatus; and (ii) etching the silicon-containing film. In the etching of the silicon-containing film, plasma is produced in the chamber body from a processing gas containing fluorine, hydrogen, and iodine, and a temperature of the workpiece is set to a temperature of 0° C. or less.

In the etching method according to an aspect, a side wall surface of the silicon-containing film formed by etching is protected by a protective substance. The protective substance includes iodide such as silicon iodide formed from silicon in the silicon-containing film and iodine in the processing gas, and the protective substance has high resistance to active species of fluorine. In addition, in the etching method according to an aspect, since the temperature of the workpiece is set to a temperature of 0° C. or less, a reaction between the silicon-containing film and fluorine radicals is suppressed. Therefore, according to the etching method according to an aspect, the silicon-containing film directly under the mask is suppressed from being etched in a lateral direction.

In an embodiment, the processing gas includes iodine-containing gas. In an embodiment, in the etching of the silicon-containing film, a ratio of a flow rate of the iodine-containing gas to an overall flow rate of the processing gas supplied into the chamber body is 2.5% or more. In an embodiment, the iodine-containing gas includes at least one selected from the group consisting of HI gas, $CF_3I$ gas, $C_2F_5I$ gas, $C_3F_7I$ gas, $IF_5$ gas, $IF_7$ gas, and $I_2$ gas.

In an embodiment, the etching of the silicon-containing film includes partially etching the silicon-containing film by plasma from the processing gas including fluorine-containing gas, and additionally etching the silicon-containing film by plasma from the processing gas further including additive gas. The additive gas contains molecules including fluorine, and binding energy of fluorine in the molecules included in the additive gas is lower than binding energy of fluorine in the molecules in the fluorine-containing gas. In this embodiment, the additive gas is added to the processing gas when a depth of the opening formed in the silicon-containing film by etching is increased. The additive gas generates a large number of active species of fluorine having smaller mass than the fluorine-containing gas in the processing gas. The active species of fluorine, which has small mass, easily reaches a deep portion in the opening. Therefore, according to this embodiment, an etching rate of the silicon-containing film is suppressed from deteriorating.

In an embodiment, the additionally etching of the silicon-containing film is performed when an aspect ratio of the opening formed in the silicon-containing film is 40 or more. In another embodiment, the additionally etching of the silicon-containing film starts when it is determined that no silicon is released from the silicon-containing film based on emission intensity of a wavelength corresponding to silicon by emission of the plasma produced in the chamber body while the partially etching of the silicon-containing film is performed.

In an embodiment, the processing gas further contains carbon. According to this embodiment, deposits containing carbon are formed on the mask. As a result, the mask is suppressed from being reduced.

In an embodiment, the silicon-containing film includes a plurality of silicon oxide films and a plurality of silicon nitride films which are alternately stacked on one another.

In an embodiment, the mask contains carbon. In this embodiment, iodine in the processing gas reacts with carbon and fluorine to form a volatile compound. Thus, the opening in the mask is suppressed from being clogged. In another embodiment, the mask contains tungsten. In this embodiment, the mask is suppressed from being etched by fluorine.

As described above, the silicon-containing film directly under the mask is suppressed from being etched in the lateral direction.

Hereinafter, various embodiments will be described in detail with reference to the drawings. Further, in the respective drawings, like reference numerals denote like parts or corresponding parts.

Figure 2:
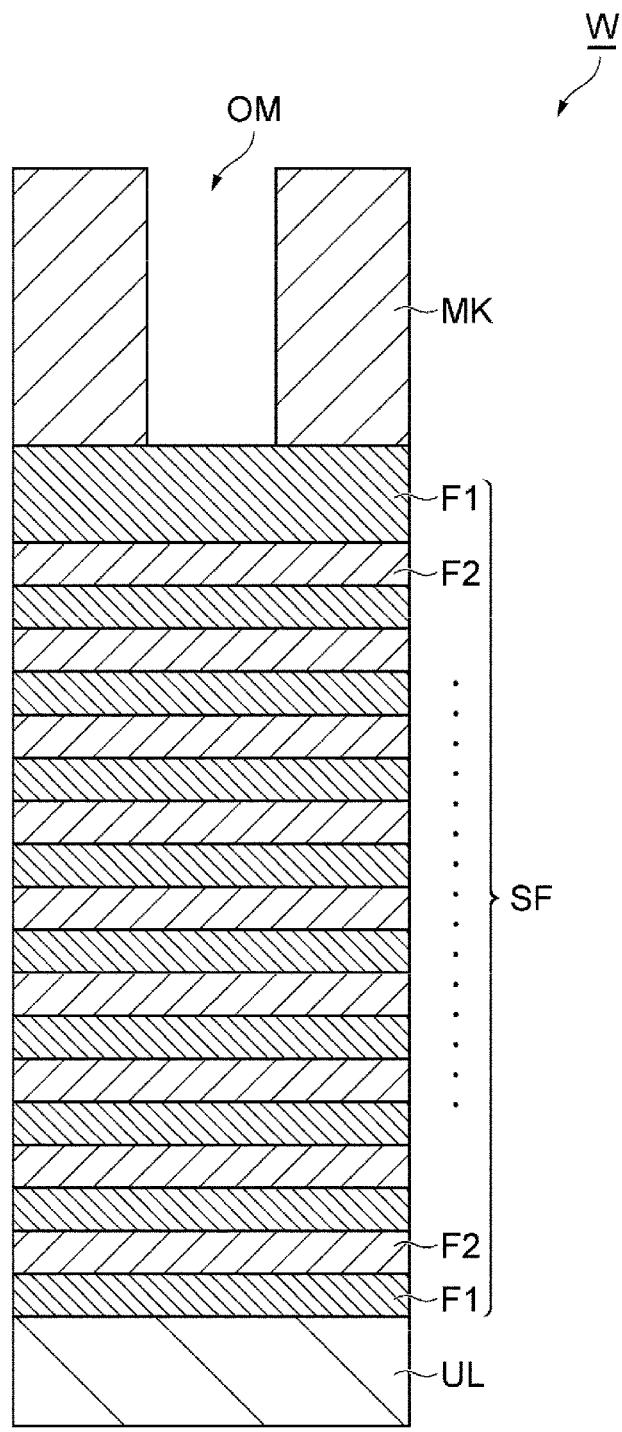
FIG. 2 is a partially enlarged cross-sectional view of an example of a workpiece to which the etching method illustrated in FIG. 1 may be applied.

FIG. 1 is a flowchart illustrating an etching method according to an embodiment. The etching method (hereinafter, referred to as a "method MT") illustrated in FIG. 1 is performed to etch a silicon-containing film. FIG. 2 is a partially enlarged cross-sectional view of an example of a workpiece to which the etching method illustrated in FIG. 1 may be applied. An example of a workpiece W illustrated in FIG. 2 has a silicon-containing film SF. The silicon-containing film SF is provided on an underlying layer UL.

The silicon-containing film SF has a plurality of first films F1 and a plurality of second films F2. The plurality of first films F1 and the plurality of second films F2 are alternately stacked on one another. The plurality of first films F1 are made of silicon oxide. The plurality of second films F2 are made of silicon nitride. That is, the workpiece W has a plurality of silicon oxide films and a plurality of silicon nitride films which are alternately stacked on one another. In the example illustrated in FIG. 2, the first film F1 is a lowermost film provided directly on the underlying layer UL, but the second film F2 may be a lowermost film provided directly on the underlying layer UL. In addition, in the example illustrated in FIG. 2, the first film F1 is an uppermost film provided directly under a mask MK, but the second film F2 may be an uppermost film provided directly under the underlying layer UL.

The workpiece W further includes the mask MK. The mask MK is provided on the silicon-containing film SF. The mask MK may be made of a carbon-containing material. The mask MK may be a mask made of amorphous carbon. Alternatively, the mask MK is made of a tungsten-containing material. For example, the mask MK is made of tungsten. Further, the mask MK may be made of any material having resistance to the etching of the silicon-containing film SF. An opening OM is formed in the mask MK. The opening OM exposes a part of a surface of the silicon-containing film SF. The opening OM is a hole or a trench. In the method MT, a pattern of the mask MK is transferred to the silicon-containing film SF by plasma etching.

Reference will be made to FIG. 1 again. Hereinafter, the method MT will be described with reference to an example in which the method MT is applied to the workpiece W illustrated in FIG. 2. However, a workpiece to which the method MT is applied is not limited to the workpiece illustrated in FIG. 2.

Figure 3:
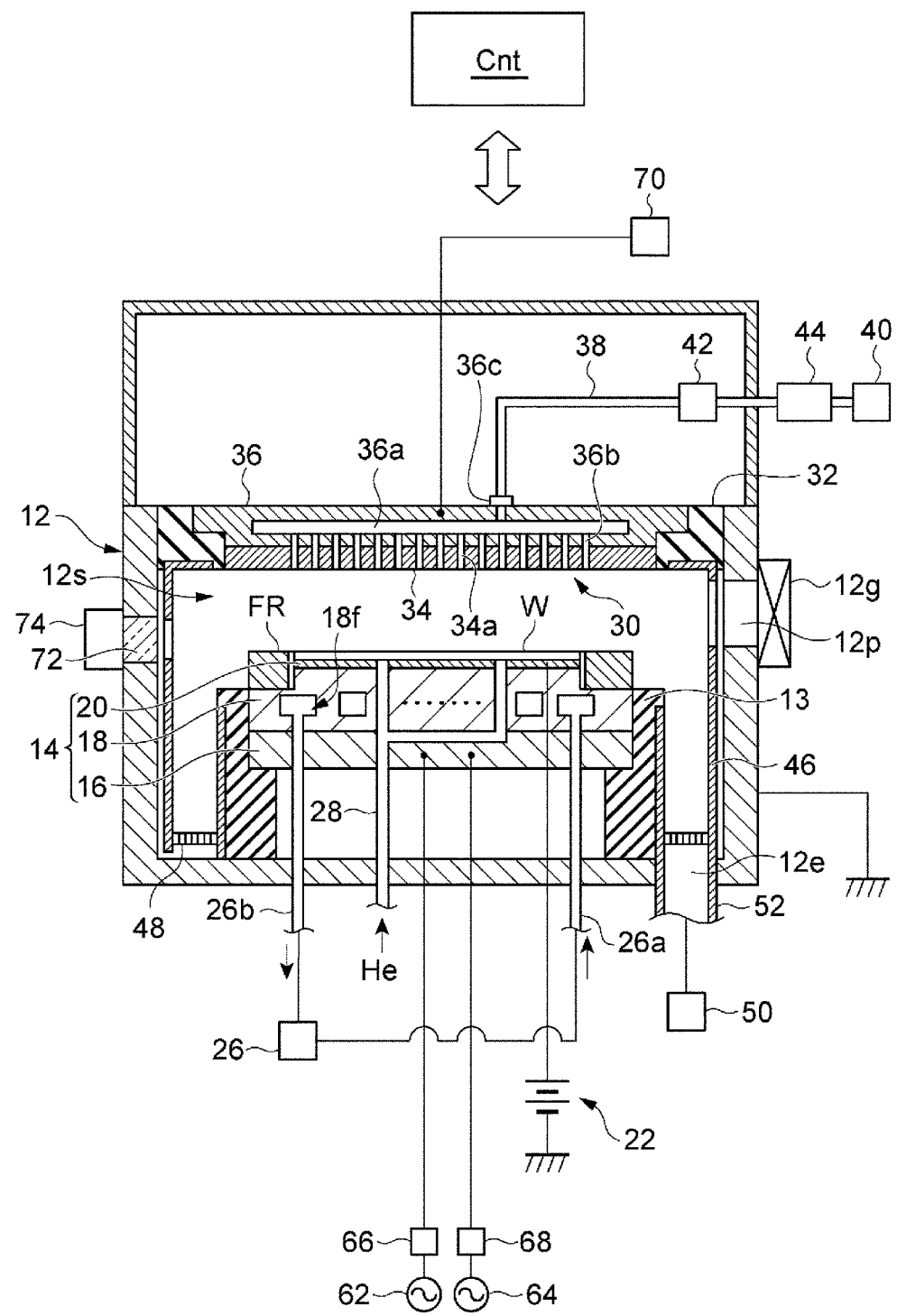
FIG. 3 is a view illustrating a plasma processing apparatus capable of being used to perform the etching method illustrated in FIG. 1.

As illustrated in FIG. 1, in the method MT, step ST1 is performed. In step ST1, the workpiece W is prepared in a chamber body of a plasma processing apparatus. FIG. 3 is a view illustrating a plasma processing apparatus capable of being used to perform the etching method illustrated in FIG. 1. A plasma processing apparatus 10 illustrated in FIG. 3 is a capacitively coupled plasma etching apparatus. The plasma processing apparatus 10 has a chamber body 12. The chamber body 12 has an approximately cylindrical shape and provides an internal space 12s. The chamber body 12 is made of, for example, aluminum. An inner wall surface of the chamber body 12 is subjected to plasma-resistant processing. For example, the inner wall surface of the chamber body 12 is subjected to anodization. The chamber body 12 is electrically grounded.

A passageway 12p is formed in a sidewall of the chamber body 12. The workpiece W passes through the passageway 12p while the workpiece W is loaded into the internal space 12s or unloaded from the internal space 12s. The passageway 12p is configured to be openable or closable by a gate valve 12g.

A support unit 13 is provided on a bottom portion of the chamber body 12. The support unit 13 is made of an insulating material. The support unit 13 has an approximately cylindrical shape. In the internal space 12s, the support unit 13 extends vertically from the bottom portion of the chamber body 12. The support unit 13 supports a stage 14. The stage 14 is provided in the internal space 12s.

The stage 14 has a lower electrode 18 and an electrostatic chuck 20. The stage 14 may further include an electrode plate 16. The electrode plate 16 is made of, for example, a conductive material such as aluminum and has an approximately disk shape. The lower electrode 18 is provided on the electrode plate 16. The lower electrode 18 is made of, for example, a conductive material such as aluminum and has an approximately disk shape. The lower electrode 18 is electrically connected to the electrode plate 16.

The electrostatic chuck 20 is provided on the lower electrode 18. The workpiece W is placed on an upper surface of the electrostatic chuck 20. The electrostatic chuck 20 has a body made of a dielectric material. An electrode in the form of a film is provided in the body of the electrostatic chuck 20. The electrode of the electrostatic chuck 20 is connected to a DC power source 22 through a switch. When a voltage is applied to the electrode of the electrostatic chuck 20 from the DC power source 22, electrostatic attractive force is generated between the electrostatic chuck 20 and the workpiece W. The workpiece W is attracted to the electrostatic chuck 20 and retained by the electrostatic chuck 20 by the generated electrostatic attractive force.

A focus ring FR is disposed on a circumferential edge portion of the lower electrode 18 so as to surround an edge of the workpiece W. The focus ring FR is provided to improve uniformity of etching. The focus ring FR may be made of, but not limited to, silicon, silicon carbide, or quartz.

A flow path 18f is provided in the lower electrode 18. A coolant is supplied into the flow path 18f via a pipe 26a from a chiller unit 26 provided outside the chamber body 12. The coolant supplied into the flow path 18f returns to the chiller unit 26 via a pipe 26b. In the plasma processing apparatus 10, a temperature of the workpiece W placed on the electrostatic chuck 20 is adjusted by heat exchange between the coolant and the lower electrode 18.

A gas supply line 28 is provided in the plasma processing apparatus 10. The gas supply line 28 supplies heat transfer gas, for example, He gas from a heat transfer gas supply mechanism to a portion between an upper surface of the electrostatic chuck 20 and a rear surface of the workpiece W.

The plasma processing apparatus 10 further includes an upper electrode 30. The upper electrode 30 is provided above the stage 14. The upper electrode 30 is supported at an upper side of the chamber body 12 by a member 32. The member 32 is made of an insulating material. The upper electrode 30 may include a top plate 34 and a support 36. A lower surface of the top plate 34 is a lower surface directed toward the internal space 12s, and the lower surface of the top plate 34 defines the internal space 12s. The top plate 34 may be made of a semiconductor or a low-resistance conductor with low Joule heat. A plurality of gas discharge holes 34a are provided in the top plate 34. The plurality of gas discharge holes 34a penetrate the top plate 34 in a thickness direction of the top plate 34.

The support 36 supports the top plate 34 so that the top plate 34 is detachable, and the support 36 may be made of a conductive material such as aluminum. A gas diffusion chamber 36a is provided in the support 36. A plurality of gas flow holes 36b, which communicate with the plurality of gas discharge holes 34a, respectively, extend downward from the gas diffusion chamber 36a. A gas introducing port 36c, which introduces processing gas into the gas diffusion chamber 36a, is formed in the support 36. A gas supply pipe 38 is connected to the gas introducing port 36c.

A gas source group 40 is connected to the gas supply pipe 38 through a valve group 42 and a flow rate controller group 44. The gas source group 40 includes a plurality of gas sources. The plurality of gas sources include sources of a plurality of gases that constitute the processing gas used for the method MT. The valve group 42 includes a plurality of opening-closing valves. The flow rate controller group 44 includes a plurality of flow rate controllers. Each of the plurality of flow rate controllers is a mass flow controller or a pressure-control flow rate controller. Each of the plurality of gas sources of the gas source group 40 is connected to the gas supply pipe 38 via the corresponding valve of the valve group 42 and the corresponding flow rate controller of the flow rate controller group 44.

In the plasma processing apparatus 10, a shield 46 is detachably provided along an inner wall of the chamber body 12. The shield 46 is also provided around an outer circumference of the support unit 13. The shield 46 prevents etching by-product from being attached to the chamber body 12. For example, the shield 46 is configured by coating an aluminum member with ceramics such as $Y_2O_3$.

A baffle plate 48 is provided between the support unit 13 and the sidewall of the chamber body 12. For example, the baffle plate 48 is configured by coating a base material made of aluminum with ceramics such as $Y_2O_3$. A plurality of through holes are formed in the baffle plate 48. A gas discharge port 12e is provided below the baffle plate 48 and in the bottom portion of the chamber body 12. A gas discharge device 50 is connected to the gas discharge port 12e through a gas discharge pipe 52. The gas discharge device 50 has a vacuum pump such as a pressure control valve or a turbo molecular pump.

The plasma processing device 10 further includes a first high-frequency power source 62 and a second high-frequency power source 64. The first high-frequency power source 62 is a power source that generates first high-frequency waves for producing plasma. A frequency of the first high-frequency wave is, for example, a frequency within a range of 27 MHz to 100 MHz. The first high-frequency power source 62 is connected to the lower electrode 18 through a matching device 66 and the electrode plate 16. The matching device 66 has a circuit for matching output impedance of the first high-frequency power source 62 and input impedance at a load side (lower electrode 18 side). Further, the first high-frequency power source 62 may be connected to the upper electrode 30 through the matching device 66.

The second high-frequency power source 64 is a power source that generates second high-frequency waves for drawing ions into the workpiece W. The frequency of the second high-frequency wave is lower than the frequency of the first high-frequency wave. The frequency of the second high-frequency wave is, for example, a frequency within a range of 400 kHz to 13.56 MHz. The second high-frequency power source 64 is connected to the lower electrode 18 through a matching device 68 and the electrode plate 16. The matching device 68 has a circuit for matching output impedance of the second high-frequency power source 64 and input impedance at the load side (lower electrode 18 side).

The plasma processing device 10 may further include a DC power source unit 70. The DC power source unit 70 is connected to the upper electrode 30. The DC power source unit 70 may generate a negative DC voltage and apply the DC voltage to the upper electrode 30.

An optical window 72 is provided in the sidewall of the chamber body 12. The optical window 72 is made of a material transparent to light from the plasma produced in the internal space 12s. The optical window 72 is made of, for example, quartz. A spectroscopic analyzer 74 is provided outside the chamber body 12 so as to face the optical window 72. The spectroscopic analyzer 74 is configured to measure a spectrum of light received through the optical window 72, that is, an emission spectrum of the plasma and output spectrum data that indicate the spectrum.

The plasma processing apparatus 10 may further include a control unit Cnt. The control unit Cnt may be a computer provided with a processor, a storage unit, an input device, a display device, and the like. The control unit Cnt controls the respective parts of the plasma processing apparatus 10. The control unit Cnt may allow an operator to perform an operation of inputting a command to manage the plasma processing apparatus 10 by using the input device. In addition, the control unit Cnt may allow the display device to visualize and display an operational situation of the plasma processing apparatus 10. Further, the storage unit of the control unit Cnt stores a control program and recipe data which allow the processor to control various types of processing to be performed by the plasma processing device 10. The processor of the control unit Cnt executes the control program and controls the respective parts of the plasma processing apparatus 10 depending on the recipe data, such that the method MT is performed by the plasma processing apparatus 10.

Figure 4:
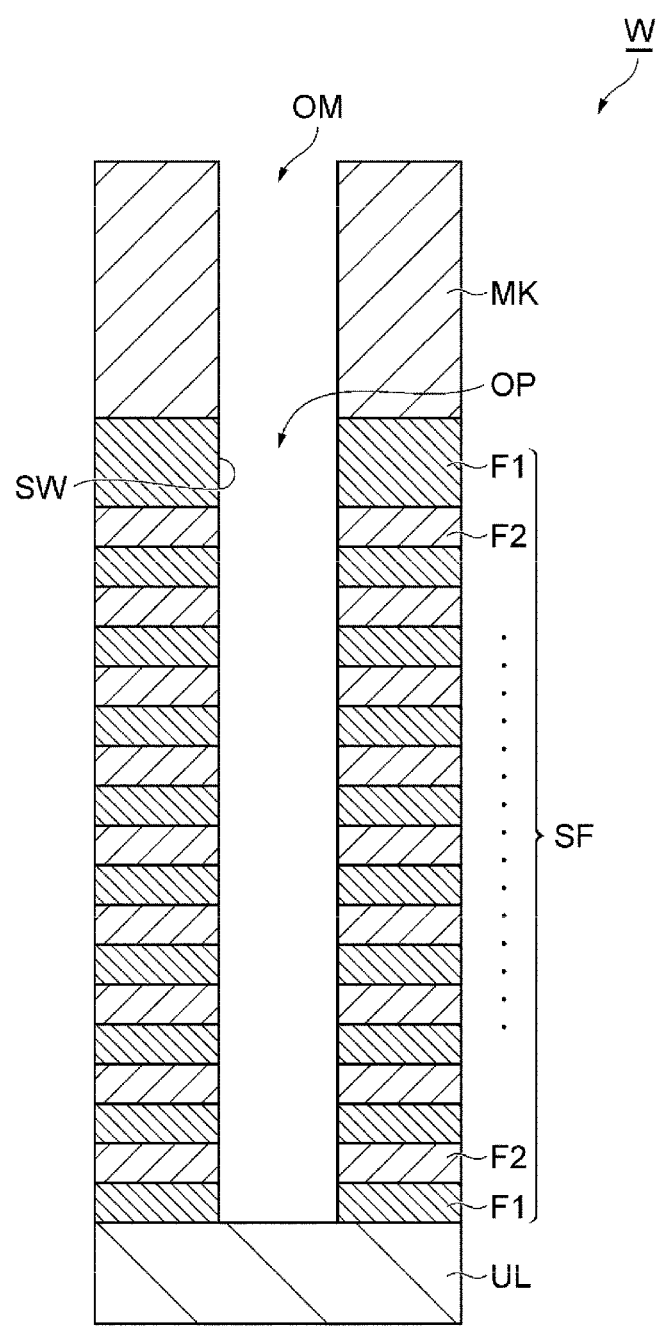
FIG. 4 is a partially enlarged cross-sectional view of the workpiece in a state after the etching method illustrated in FIG. 1 is applied.

Referring back to FIG. 1, the method MT will be described with reference to an example in which the plasma processing apparatus 10 is used. However, a plasma processing apparatus used to perform the method MT is not limited to the plasma processing apparatus 10. In the following description, see FIG. 4 together with FIG. 1. FIG. 4 is a partially enlarged cross-sectional view of the workpiece in a state after the etching method illustrated in FIG. 1 is applied.

As described above, in step ST1 in the method MT, the workpiece W is prepared in the chamber body 12 of the plasma processing apparatus 10. The workpiece W is placed on the electrostatic chuck 20 of the stage 14 in the internal space 12s. The workpiece W is retained by the electrostatic chuck 20.

Subsequently, in the method MT, step ST2 is performed. In step ST2, the silicon-containing film SF is etched in the chamber body 12 of the plasma processing apparatus 10. In step ST2, the processing gas is supplied into the internal space 12s. The processing gas contains fluorine, hydrogen, and iodine. In an embodiment, the processing gas is a gas mixture of a fluorine-containing gas, a hydrogen-containing gas, and an iodine-containing gas. The fluorine-containing gas may include one or more of fluorocarbon gas such as $CF_4$ gas, hydrofluorocarbon gas, $SF_6$ gas, and $NF_3$ gas. The hydrogen-containing gas is, for example, $H_2$ gas. The iodine-containing gas includes, for example, one or more gases selected from hydrogen iodide gas (HI gas), iodofluorocarbon gas ($CF_xI_y$ gas or $C_zF_xI_y$ gas), $IF_5$ gas, $IF_7$ gas, and iodine gas ($I_2$ gas). Here, in the "$CF_xI_y$," and "$C_zF_xI_y$," each of x and y is an integer equal to or larger than 1, and z is an integer equal to or larger than 2. For example, one or more of $CF_3I$ gas, $C_2F_5I$ gas, and $C_3F_7I$ gas may be used as the iodofluorocarbon gas. Further, the processing gas may be a gas mixture including a plurality of optional gases as long as the processing gas contains fluorine, hydrogen, and iodine. In an embodiment, a ratio of a flow rate of the iodine-containing gas to an overall flow rate of the processing gas is 2.5% or more. In an embodiment, the processing gas may further contain carbon. The processing gas may include hydrofluorocarbon gas and/or fluorocarbon gas such as, for example, $CF_4$ gas and/or $CH_xF_y$ gas. Here, each of the x and y in the "$CH_xF_y$" is an integer equal to or larger than 1.

In step ST2, pressure in the internal space 12s is decreased to predetermined pressure by the gas discharge device 50. In addition, in step ST2, the lower electrode 18 is supplied with the first high-frequency waves from the first high-frequency power source 62 and the second high-frequency waves from the second high-frequency power source 64. Further, the first high-frequency waves may be supplied to the upper electrode 30 instead of the lower electrode 18. Further, in step ST2, as the coolant is supplied into the flow path 18f, a temperature of the workpiece W is set to a temperature of 0° C. or less.

In step ST2, plasma is produced from the processing gas. In step ST2, the silicon-containing film SF is etched in a film thickness direction thereof by active species (ions and/or radicals) of fluorine from the plasma. As a result of performing step ST2, an opening OP is formed in the silicon-containing film SF, as illustrated in FIG. 4.

While step ST2 is performed, a side wall surface SW of the silicon-containing film SF, which defines the opening OP formed by the etching, is protected by a protective substance. The protective substance includes iodide such as silicon iodide formed from silicon in the silicon-containing film SF and iodine in the processing gas. The protective substance has high resistance to the active species of fluorine. In addition, while step ST2 is performed, the temperature of the workpiece W is set to a temperature of 0° C. or less. The radical of fluorine is an active species that may chemically and isotropically etch the silicon-containing film SF, but when the temperature of the workpiece W is set to a temperature of 0° C. or less, a reaction between the radical of fluorine and the silicon-containing film SF is suppressed. Therefore, according to the method MT, the silicon-containing film SF directly under the mask MK is suppressed from being etched in a lateral direction. Further, in the case where the mask MK contains carbon, iodine in the processing gas reacts with carbon and fluorine to form a volatile compound while step ST2 is performed. Therefore, the opening in the mask MK is suppressed from being clogged. Alternatively, in the case where the mask MK contains tungsten, the mask MK is suppressed from being etched by fluorine, such that the mask MK is suppressed from being deformed in shape in step ST2.

In an embodiment, the processing gas further contains carbon, as described above. While step ST2 is performed, the mask MK is etched as the iodine in the processing gas reacts with the carbon and the fluorine to form a volatile compound. However, deposits including carbon are formed on the mask. As a result, the mask MK is suppressed from being reduced.

In an embodiment, step ST2 may include step ST21 and step ST22. In step ST21, the silicon-containing film SF is partially etched in the chamber body 12 of the plasma processing apparatus 10. In step ST21, the aforementioned processing gas is supplied into the internal space 12s. In step ST21, the pressure in the internal space 12s is decreased to the predetermined pressure by the gas discharge device 50. In addition, in step ST21, the lower electrode 18 is supplied with the first high-frequency waves from the first high-frequency power source 62 and the second high-frequency waves from the second high-frequency power source 64. Further, the first high-frequency waves may be supplied to the upper electrode 30 instead of the lower electrode 18. Further, in step ST21, as the coolant is supplied into the flow path 18f, the temperature of the workpiece W is set to a temperature of 0° C. or less. In step ST21, the silicon-containing film SF is etched so that an opening is formed to have a depth having a predetermined ratio to a depth of the opening OP to be formed by performing step ST2.

In the subsequent process ST22, the silicon-containing film SF is additionally etched in the chamber body 12 of the plasma processing apparatus 10. In step ST22, processing gas, which is made by further adding additive gas to the processing gas used for step ST21, is supplied into the internal space 12s. In step ST22, the pressure in the internal space 12s is decreased to the predetermined pressure by the gas discharge device 50. In addition, in step ST22, the lower electrode 18 is supplied with the first high-frequency waves from the first high-frequency power source 62 and the second high-frequency waves from the second high-frequency power source 64. Further, the first high-frequency waves may be supplied to the upper electrode 30 instead of the lower electrode 18. Further, in step ST22, as the coolant is supplied into the flow path 18f, the temperature of the workpiece W is set to a temperature of 0° C. or less.

The additive gas, which is added to the processing gas in step ST22, contains molecules including fluorine. Binding energy of fluorine in the molecules in the additive gas is lower than binding energy of fluorine in molecules in the fluorine-containing gas included in the processing gas. Here, binding energy between carbon and fluorine in $CF_4$ is 453 kJ/mol, binding energy between sulfur and fluorine in $SF_6$ is 327 kJ/mol, binding energy between nitrogen and fluorine in $NF_3$ is 272 kJ/mol, binding energy between iodine and fluorine in $IF_7$ is 263 kJ/mol, and binding energy between fluorine and fluorine in $F_2$ is 154 kJ/mol. Therefore, as an example, $SF_6$ gas, $NF_3$ gas, $IF_7$ gas, or $F_2$ gas may be used as the additive gas in the case where the fluorine-containing gas in the processing gas is $CF_4$ gas. As another example, $NF_3$ gas, $IF_7$ gas, or $F_2$ gas may be used as the additive gas in the case where the fluorine-containing gas in the processing gas is $SF_6$ gas.

If a depth of an opening, which is formed in the silicon-containing film SF by etching in step ST21, is increased, the active species of fluorine hardly reaches a deep portion in the opening, and as a result, an etching rate deteriorates. In step ST22, the additive gas is added to the processing gas to suppress the deterioration in etching rate. The additive gas generates a large number of active species of fluorine having smaller mass than the fluorine-containing gas in the processing gas. The active species of fluorine, which has small mass, easily reaches the deep portion in the opening. Therefore, as the processing goes from step ST21 to step ST22, the deterioration in etching rate of the silicon-containing film SF is suppressed.

In an embodiment, step ST22 is performed when an aspect ratio of the opening formed in the silicon-containing film SF is 40 or more. In other words, step ST21 is performed for a period of time for which the opening having an aspect ratio smaller than 40 is formed in the silicon-containing film SF. For example, when the performance time of step ST21 becomes predetermined time, the processing goes from step ST21 to step ST22.

In another embodiment, the spectroscopic analyzer 74 acquires spectrum data that indicate an emission spectrum of the plasma produced in the internal space 12s while step ST21 is performed. Further, in a case where it is determined that no silicon is released from the silicon-containing film SF based on emission intensity of a wavelength corresponding to silicon specified from the spectrum data (hereinafter, referred to as "emission intensity of silicon"), step ST22 starts as the processing goes from step ST21 to step ST22 under control of the control unit Cnt. Further, the wavelength corresponding to silicon is, for example, 221.1 nm, 221.2 nm, 221.7 nm, 250.7 nm, 251.6 nm, 252.4 nm, 252.9 nm, or 288.2 nm. In addition, when the emission intensity of silicon is a reference value or less, the processing goes from step ST21 to step ST22. As a more specific example, argon gas of several sccm is added to the processing gas, and a ratio between the emission intensity of silicon and emission intensity of a wavelength corresponding to argon (hereinafter, referred to as "emission intensity of argon") is acquired while step ST21 is performed. The processing goes from step ST21 to step ST22 in a case where the acquired ratio is decreased to about 50% or less of an average of the ratio for 30 seconds after step ST21 starts. Further, the wavelength corresponding to argon is, for example, 738.4 nm, 750.4 nm, 763.5 nm, or 811.5 nm. By acquiring the aforementioned ratio, that is, a value obtained by dividing the emission intensity of silicon by the emission intensity of argon, it is possible to obtain a parameter that indicates emission intensity derived from the active species that does not depend on the state of the plasma. In addition, instead of the emission intensity of silicon, emission intensity corresponding to a wavelength of silicon fluoride (SiF), which is a reaction product, may be used. The wavelength corresponding to silicon fluoride is, for example, 436.8 nm, 440.1 nm, or 443.0 nm.

While the various embodiments have been described above, various modified aspects may be made without being limited to the aforementioned embodiments. For example, the silicon-containing film SF may be a film made of at least one of silicon oxide and silicon nitride. For example, the silicon-containing film SF may be a single film made of silicon oxide or silicon nitride. In addition, the plasma processing apparatus used to perform the method MT may be any plasma processing apparatus such as an inductively coupled plasma processing apparatus or a plasma processing apparatus that produces plasma by using surface waves such as microwaves.

Hereinafter, a simulation, which was performed to evaluate the method MT, will be described. In the simulation, a relationship between a temperature of the silicon oxide film and an etching rate by a fluorine radical of the silicon oxide film was obtained. Specifically, an etching rate $E_{SiO2}$ (angstrom/min) of the silicon oxide film was obtained by the following Equation 1.

$$E_{SiO2} = 0.61 \times 10^{-12} n_{FS} T^{1/2} e^{-1892/T} \quad (1)$$

In Equation 1, nFS is density ($cm^{-3}$) of a fluorine atom, and T(K) is a temperature of the silicon oxide film.

Figure 5:
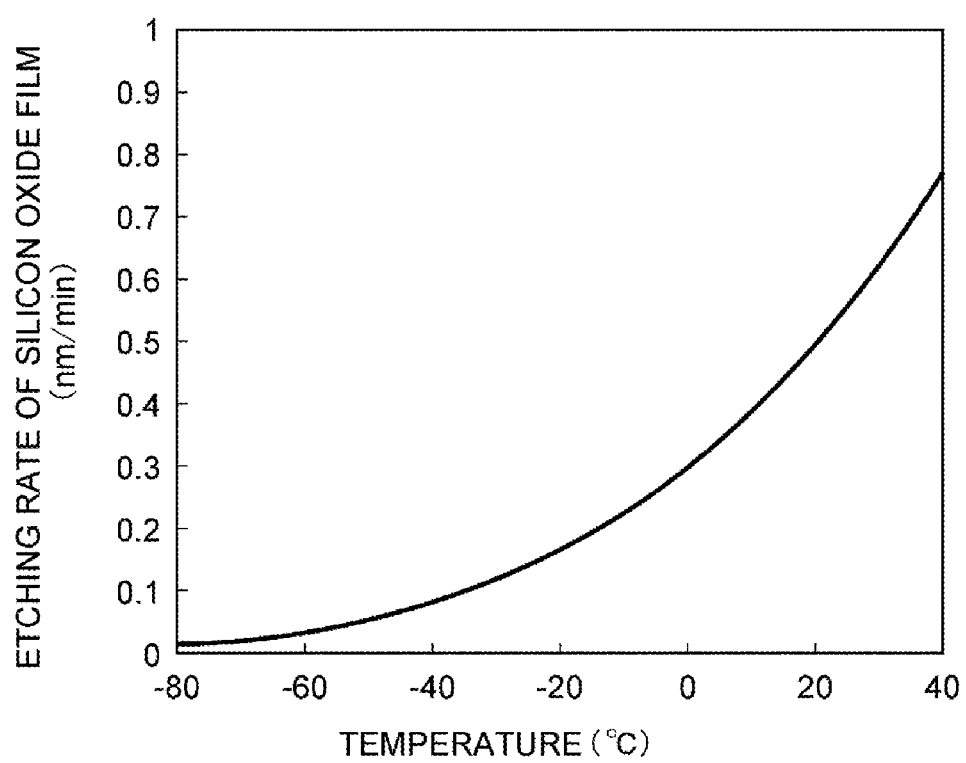
FIG. 5 is a graph illustrating a simulation result.

FIG. 5 is a graph illustrating a simulation result. In the graph in FIG. 5, the horizontal axis indicates a temperature of the silicon oxide film, and the vertical axis indicates an etching rate of the silicon oxide film. As illustrated in FIG. 5, the etching rate of the silicon oxide film by the fluorine radical is significantly small when the temperature of the silicon oxide film is 0° C. or less. Therefore, it was ascertained that a reaction between the silicon-containing film SF and a radical of fluorine, which may etch the silicon-containing film SF in the lateral direction, was suppressed when the temperature of the workpiece W having the silicon-containing film SF is set to a temperature of 0° C. or less.

Hereinafter, an test, which was performed to evaluate the method MT, will be described. Further, the present disclosure is not limited to the test described below.

Figure 6:
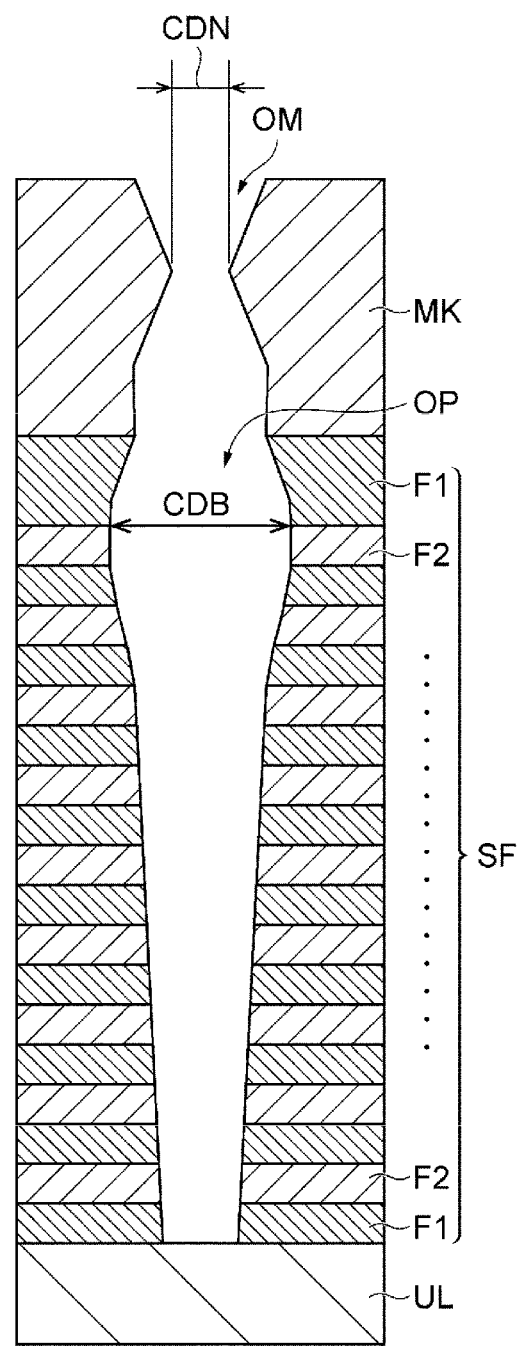
FIG. 6 is a view illustrating dimensions measured in a first test.

In a first test, the silicon-containing film SF of the workpiece W illustrated in FIG. 2 was etched by using the plasma processing apparatus 10. In the first test, the silicon-containing film SF was etched depending on various settings regarding a flow rate of HBr gas or a flow rate of HI gas in the processing gas. A condition of the first test is as follows.
<Condition of First Test>
Pressure in the internal space of the chamber body 12: 40 mTorr (5.333 Pa)
First high-frequency wave: 100 MHz, 4.8 kW
Second high-frequency wave: 0.4 MHz, 5 kW
Processing Gas
Flow rate of $H_2$ gas: 150 sccm
Flow rate of $SF_6$ gas: 40 sccm
Temperature of the workpiece: −60° C.
Processing time: 150 seconds In the first test, a width CDN and a width CDB after etching were measured. FIG. 6 is a view illustrating dimensions measured in the first test. As illustrated in FIG. 6, CDN is a minimum width of the opening OM in the mask MK. CDN is a measure that reflects a decrease in width of the opening OM in the mask MK. The larger CDN indicates that the width of the opening OM in the mask MK is decreased, and the opening OM is suppressed from being clogged. CDB is a maximum width of the opening OP at a portion directly under the mask MK. CDB is a measure that reflects a degree to which the silicon-containing film SF directly under the mask MK is etched in the lateral direction. The smaller CDB indicates that the silicon-containing film SF directly under the mask MK is suppressed from being etched in the lateral direction.

Figure 7A:
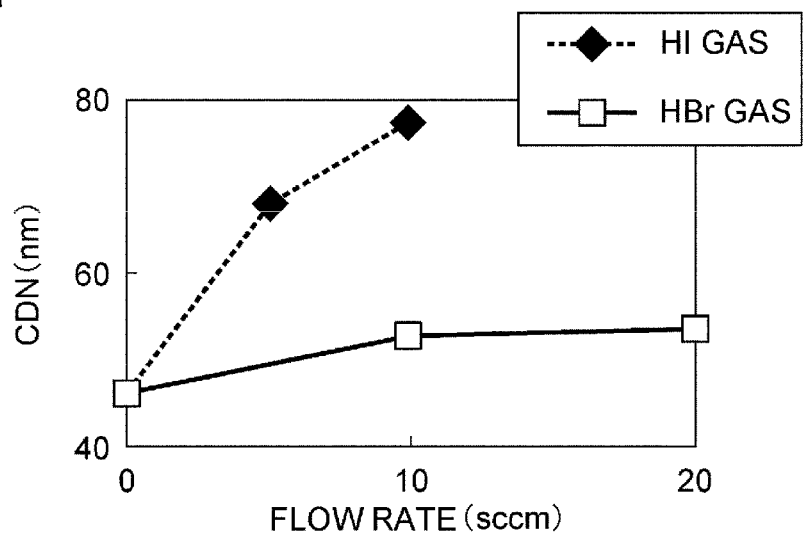
FIG. 7A is a graph illustrating a relationship between a width CDN and a flow rate of HBr gas or HI gas which is obtained in the first test.
Figure 7B:
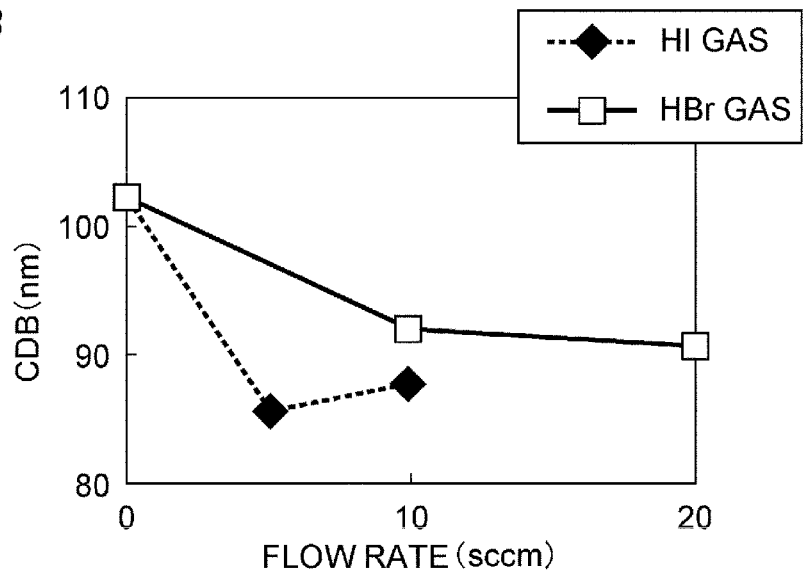
FIG. 7B is a graph illustrating a relationship between a width CDB and the flow rate of HBr gas or HI gas which is obtained in the first test.

FIG. 7A is a graph illustrating a relationship between the width CDN and the flow rate of HBr gas or HI gas which is obtained in the first test, and FIG. 7B is a graph illustrating a relationship between the width CDB and the flow rate of HBr gas or HI gas which is obtained in the first test. In the graph in FIG. 7A, the horizontal axis indicates a flow rate of HBr gas or HI gas, and the vertical axis indicates CDN. In the graph in FIG. 7B, the horizontal axis indicates a flow rate of HBr gas or HI gas, and the vertical axis indicates CDB. As illustrated in FIG. 7A, it was ascertained that as HI gas was included in the processing gas, larger CDN and smaller CDB could be obtained in comparison with the case where HBr gas was used instead of HI gas. That is, it was ascertained that as HI gas was included in the processing gas, the opening OM in the mask MK could be suppressed from being decreased or clogged, and the silicon-containing film SF directly under the mask MK could be suppressed from being etched in the lateral direction. In addition, it was ascertained that as HI gas of 5 sccm was included in the processing gas with respect to an overall flow rate (20 sccm) of the processing gas, that is, when HI gas having a flow rate of 2.5% or more of the overall flow rate of the processing gas was included in the processing gas, the opening OM in the mask MK could be suppressed from being decreased or clogged, and the silicon-containing film SF directly under the mask MK could be suppressed from being etched in the lateral direction.

Hereinafter, a second test will be described. In the second test, the silicon-containing film SF of the workpiece W illustrated in FIG. 2 was etched by using the plasma processing apparatus 10. In the second test, dependency of an etching rate of the silicon-containing film SF with respect to classification of fluorine-containing gas in the processing gas was obtained. Specifically, an etching rate of the silicon-containing film SF was obtained in a case where $CF_4$ gas was used as the fluorine-containing gas, an etching rate of the silicon-containing film SF was obtained in a case where $SF_6$ gas was used as the fluorine-containing gas, and an etching rate of the silicon-containing film SF was obtained in a case where $NF_3$ gas was used as the fluorine-containing gas. A condition of the second test is as follows.
<Condition of Second Test>
Pressure in the internal space of the chamber body 12: 40 mTorr (5.333 Pa)
First high-frequency wave: 100 MHz, 4.8 kW
Second high-frequency wave: 0.4 MHz, 5 kW
Processing Gas
Flow rate of $H_2$ gas: 120 sccm
Flow rate of fluorine-containing gas: 80 sccm
Flow rate of HI gas: 5 sccm
Temperature of the workpiece: −60° C.
Processing time: 150 seconds As a result of the second test, the etching rate of the silicon-containing film SF in the case where $CF_4$ gas was used as the fluorine-containing gas, the etching rate of the silicon-containing film SF in the case where $SF_6$ gas was used as the fluorine-containing gas, and the etching rate of the silicon-containing film SF in the case w $NF_3$ gas was used as the fluorine-containing gas were 1,123 nm/min, 1,222 nm/min, and 1,272 nm/min, respectively. As described above, the binding energy between carbon and fluorine in $CF_4$ is 453 kJ/mol, the binding energy between sulfur and fluorine in $SF_6$ is 327 kJ/mol, and the binding energy between nitrogen and fluorine in $NF_3$ is 272 kJ/mol. Therefore, it was ascertained that as the gas containing molecules having low energy as the binding energy of fluorine was used, a high etching rate could be obtained even though a deep opening was formed in the silicon-containing film SF. Accordingly, it was ascertained that as the additive gas containing molecules having low energy as the binding energy of fluorine was added to the processing gas after the silicon-containing film SF was partially etched by the plasma from the processing gas, deterioration in etching rate could be suppressed even though a deep opening was formed in the silicon-containing film SF.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching a silicon-containing film, the method comprising:
preparing a workpiece including the silicon-containing film and a mask provided on the silicon-containing film and having an opening formed therein, in a chamber body of a plasma processing apparatus; and
etching the silicon-containing film in a film-thickness direction through the mask,
wherein in the etching of the silicon-containing film, plasma is produced in the chamber body from a processing gas containing fluorine, hydrogen, and iodine, and a temperature of the workpiece is set to a temperature of 0° C. or less,
the processing gas includes an iodine-containing gas, and the iodine-containing gas includes at least one selected from the group consisting of HI gas, $CF_3I$ gas, $C_2F_5I$ gas, $C_3F_7I$ gas, $IF_5$ gas, and $IF_7$ gas.

2. The method of claim 1, wherein in the etching of the silicon-containing film, a ratio of a flow rate of the iodine-containing gas to an overall flow rate of the processing gas supplied into the chamber body is 2.5% or more.

3. The method of claim 1, wherein the processing gas further contains carbon.

4. The method of claim 1, wherein the silicon-containing film includes a plurality of silicon oxide films and a plurality of silicon nitride films which are alternately stacked on one another.

5. The method of claim 1, wherein the mask contains carbon.

6. The method of claim 1, wherein the mask contains tungsten.

7. The method of claim 1, wherein the etching of the silicon-containing film includes:
partially etching the silicon-containing film by plasma from the processing gas including a fluorine-containing gas; and
additionally etching the silicon-containing film by plasma from the processing gas further including an additive gas, and
the additive gas contains molecules containing fluorine, and binding energy of fluorine in the molecules contained in the additive gas is lower than binding energy of fluorine in molecules in the fluorine-containing gas.

8. The method of claim 7, wherein the additionally etching of the silicon-containing film is performed when an aspect ratio of the opening formed in the silicon-containing film is 40 or more.

9. A method of etching a silicon-containing film made of at least one of silicon oxide and silicon nitride, the method comprising:
preparing a workpiece including the silicon-containing film and a mask provided on the silicon-containing film and having an opening formed therein, in a chamber body of a plasma processing apparatus; and
etching the silicon-containing film,
wherein the etching of the silicon-containing film includes:
partially etching the silicon-containing film by plasma from the processing gas including a fluorine-containing gas; and
additionally etching the silicon-containing film by plasma from the processing gas including an additive gas,
wherein the additive gas contains molecules containing fluorine, and binding energy of fluorine in the molecules contained in the additive gas is lower than binding energy of fluorine in molecules in the fluorine-containing gas,
wherein the additionally etching of the silicon-containing film starts when in response to determining that no silicon is released from the silicon-containing film based on emission intensity of a wavelength corresponding to silicon by emission of the plasma produced in the chamber body while the partially etching of the silicon-containing film is performed, and
wherein in the etching of the silicon-containing film, plasma is produced in the chamber body from a processing gas containing fluorine, hydrogen, and iodine, and a temperature of the workpiece is set to a temperature of 0° C. or less.

10. An etching method comprising:
providing, in a process chamber, a workpiece including a silicon-containing film including a silicon containing film that includes alternating layers of silicon oxide and silicon nitride and a mask on the silicon containing film;
setting a temperature of the workpiece to a temperature of 0° C. or less;
flowing a gas mixture including fluorine-containing gas, hydrogen ($H_2$) gas, and at least one iodine-containing gas selected from a group consisting of hydrogen iodide gas (HI gas), iodofluorocarbon gas (CFxIy gas or CzFxIy gas), $IF_5$ gas, and $IF_7$ gas into the process chamber; and
forming the gas mixture into plasma to etch the alternating layers of silicon oxide and silicon nitride in a film-thickness direction through the mask.

11. The etching method of claim 10, wherein the iodofluorocarbon gas is at least one selected from the group consisting of $CF_3I$, $C_2F_5I$, and $C_3F_7I$.

12. The etching method of claim 10, wherein the fluorine containing gas includes at least one selected from the group consisting of fluorocarbon, hydrofluorocarbon, $SF_6$, and $NF_3$.

13. The etching method of claim 10, wherein in the etching of the silicon-containing film, iodide is formed on a sidewall of an etching opening to protect the sidewall from active species of fluorine.

14. The etching method of claim 10, wherein the iodide is formed directly under the mask to protect the sidewall of the opening.

15. The etching method of claim 10, wherein the mask includes carbon.

16. The etching method of claim 10, wherein a CDN measured when HI gas is included in the gas mixture is larger than a CDN measured when the HI gas is not included in the gas mixture, the CDN defining a decrease in width of an opening of the mask, and
a CDB measured when the HI gas is included in the gas mixture is smaller than a CDB measured when the HI gas is not included in the gas mixture, the CDB defining a degree to which the silicon-containing film provided directly under the mask is etched in a lateral direction.

17. The etching method of claim 10, further comprising applying a radio frequency power to the workpiece for drawing ions to the workpiece while forming the gas mixture into the plasma.

* * * * *